United States Patent
Daughtry, Jr. et al.

[11] Patent Number: 5,940,748
[45] Date of Patent: Aug. 17, 1999

[54] METHOD AND SYSTEM FOR DETERMINING THE INTEGRITY OF A RECEIVED SIGNAL

[75] Inventors: Earl A. Daughtry, Jr., Lawrenceville; Mark A. Ruff, Cumming, both of Ga.

[73] Assignee: Matsushita Communications Industrial Corporation, Peachtree City, Ga.

[21] Appl. No.: 08/804,716

[22] Filed: Feb. 21, 1997

Related U.S. Application Data

[60] Provisional application No. 60/012,198, Feb. 23, 1996.

[51] Int. Cl.$^6$ ..................................................... H04B 1/06
[52] U.S. Cl. ..................................... 455/182.2; 455/192.2
[58] Field of Search ............................ 455/164.1, 182.2, 455/183.2, 161.3, 161.2, 226.3, 67.3, 296, 311, 292, 192.2, 226.2, 423

[56] References Cited

U.S. PATENT DOCUMENTS

| | | | |
|---|---|---|---|
| 3,992,670 | 4/1975 | Gittins | 455/115 |
| 4,099,048 | 7/1978 | Eichenlaub | 235/92 |
| 4,123,716 | 10/1978 | Borg | 455/164.1 |
| 4,998,289 | 6/1988 | Rabe et al. | 455/296 |
| 5,446,756 | 8/1995 | Mallinckrodt | 455/423 |
| 5,634,193 | 4/1996 | Ghisler | 455/440 |

FOREIGN PATENT DOCUMENTS 0 580 294 A2  1/1994  European Pat. Off. .

*Primary Examiner*—Salvatore Cangialosi
*Attorney, Agent, or Firm*—Gregory Scott Smith, Esq.; Troutman Sanders LLP

[57] ABSTRACT

A method for determining the integrity of a received signal in a frequency tracking environment so that a determination can be made whether Automatic Frequency Control (AFC) can be utilized. Several samples of the frequency are taken (205). At least one statistic based on these frequency samples is calculated for use in determining whether the received signal may be used for AFC operation. These statistics may include, for example, the mean, the mean deviation, the standard deviation, and the variance of the measured frequency. A strong signal limit and a weak signal limit are used to determine whether AFC operation should be disabled. If the calculated statistic is less than the strong signal limit (210) then AFC operation is enabled. If the calculated statistic is also greater than the weak signal limit (220) then AFC operation is disabled (225). This allows the receiver to continue AFC operation until the signal level is so weak as to cause erroneous frequency measurements. If the calculated statistic is between the strong signal limit (210) and the weak signal limit (220) then the signal strength is tested (230). If the signal strength is below a minimum value then AFC operation is enabled but if the signal strength is above this minimum value then AFC operation is disabled because a strong interfering signal may be present.

16 Claims, 7 Drawing Sheets

METHOD AND SYSTEM FOR DETERMINING THE INTEGRITY OF A RECEIVED SIGNAL

CROSS REFERENCE TO RELATED APPLICATION

This application claims the priority of U.S. Provisional Patent Application No. 60/012,198, filed Feb. 23, 1996.

TECHNICAL FIELD

This invention relates to a system and method for determining the integrity of a received signal in a frequency tracking environment. In particular, the invention relates to a system and method for determining reference signal integrity in an Automatic Frequency Control tracking environment.

BACKGROUND OF THE INVENTION

Cellular telephones are becoming commonplace in today's world. Cellular telephones typically include a full duplex transceiver that can both transmit and receive signals on the frequencies authorized for cellular telephones. Frequency allocations are a limited resource. Thus, in order to accommodate as many communications as possible, the bandwidth of each communication is limited and each communication must be on one channel of a predefined plurality of channels. There is very little guard space, or free bandwidth, available between adjacent channels, so it is critical that each cellular telephone operate precisely within its assigned channel and not drift astray into the bandwidth of an adjacent channel. The regulatory authority of each country, such as the Federal Communications Commission (FCC) in the United States of America, sets the channel frequencies, the channel spacing, and the frequency tolerance. The frequency tolerance is a measurement of how much the cellular telephone may deviate from its allocated frequency. If the tolerance is too high, then the cellular telephone may interfere with the communications on an adjacent channel. If the tolerance is too low, then the cellular telephone will require a very high precision oscillator and the cost of the cellular telephone will be increased.

FCC regulations for cellular telephones specify that a cellular telephone must maintain a frequency error of less than ±2.5 parts per million (ppm). To meet this requirement, some cellular telephones use a temperature compensated crystal oscillator (TCXO) which has a frequency error of less than ±2.5 ppm. An alternative to the TCXO is an uncompensated voltage controlled crystal oscillator (VCXO). The output frequency of the VCXO is compared with the frequency of the received signal transmitted by the Mobile Telephone Switching Office (MTSO) of the cellular system. The FCC also specifies the tolerance of the MTSO, a frequency error less than 0.2 parts per million. The cellular telephone thus adjusts its own frequency to match the frequency of the MTSO. This is commonly referred to as Automatic Frequency Control (AFC), a well-known method through which a receiver acquires the frequency stability of another source by comparing the frequency of the received signal from that source with the frequency of its own oscillator and then adjusting, as necessary, its own oscillator. Thus, even if the oscillator in the cellular telephone is not a high precision oscillator, or is subject to drift due to aging, temperature, or battery voltage, the receiver in the cellular telephone employing AFC will track the frequency of the received cellular signal from the MTSO to provide a stable signal with the specified frequency tolerance.

However, AFC should not be performed when the received signal is weak or is subject to strong interference because the receiver may track the noise or interference rather than the proper received signal. A problem encountered is that the power of the received signal decreases as the cellular telephone is moved farther away from the cellular tower transmitting the cellular signal, so the relative amount of noise increases. Consider a first case where the received signal is very strong. The measured frequency will be due primarily to the received signal, the standard deviation of the measured frequency of the received signal will be small, and there will be high confidence that the received signal is valid and may be used for AFC operation. As the received signal strength decreases the relative amount of noise will increase, so the standard deviation will increase. However, if the standard deviation is still small, then there still will be confidence that the received signal is valid and may be used for AFC operation. As the received signal strength decreases even further, the standard deviation continues to increase. However, at this point the center frequency of the IF bandpass filter becomes significant. The noise will be gaussian, but centered at the center frequency of the IF bandpass filter. Thus, if the center frequency of the IF bandpass filter is, for example, above the frequency of the IF signal resulting from the received signal, then the noise will be unevenly distributed and will be mostly above the received signal IF frequency. Thus, the measured median frequency will be above the received signal IF frequency so the AFC will move the oscillator frequency so as to center this measured median frequency in the IF bandpass. This will cause the received signal IF frequency to be even lower in the IF bandpass, so the measured median frequency will be above the received signal IF frequency and the AFC will again move the oscillator frequency so as to center this measured median frequency in the IF bandpass. This process continues until the AFC has shifted the oscillator frequency to the point where the received signal IF frequency is so far from the IF center frequency that it has no effect. In other words, frequency lock with the desired signal has been lost.

To help combat this problem, a DC voltage measurement corresponding to the received signal power, also known as a Receiver Signal Strength Indicator (RSSI), is used to determine whether the received signal power is strong enough, or the signal-to-noise ratio is large enough, to ensure that accurate frequency tracking will occur. Although the RSSI is useful, it also suffers from its own problems.

One problem encountered with the RSSI is that it is not useful in representing signal quality over the entire sensitivity range of a receiver, especially near the minimum discernible threshold of the receiver. Therefore, AFC is typically shut off in weak received signal conditions because there is no valid indication of the signal quality. However, shutting off the AFC limits the frequency stability of the transceiver to the frequency stability of its own oscillator. This may be unnecessary because, even if the signal is weak, it may still be strong enough to provide a reference for AFC operation. Therefore, use of only the RSSI may prematurely disable AFC operation.

Another problem encountered with the RSSI is that the RSSI is simply a measure of received signal power in the IF bandpass of the receiver. The RSSI cannot differentiate between a strong interfering signal and the desired reference signal if they are both in the IF bandpass and cannot provide information about whether the interference is strong enough to compromise accurate frequency tracking. For example, consider where the desired received signal is centered at the center frequency of the IF bandpass, but that there is a strong interfering signal up the upper edge of the IF bandpass, or even outside of the IF bandpass if the interfering signal is strong enough. The measured frequency will be between the frequency of the desired received signal and the frequency of the interfering signal. Thus, the measured median frequency will be above the received signal IF frequency so the AFC will move the oscillator frequency so as to center this measured median frequency in the IF bandpass. This will cause the received signal IF frequency to be even lower in the IF bandpass and the interfering signal will be closer to or more within the IF bandpass, so the effect of the interfering signal will be even stronger, and the AFC will again move the oscillator frequency so as to center this measured median frequency in the IF bandpass. This process continues until the AFC has shifted the oscillator frequency to the point where the interfering signal controls the AFC. In other words, frequency lock with the desired signal has been lost. Therefore, even in the presence of a strong received signal, there is the possibility that a stronger interfering signal can pull the transceiver off the desired frequency in the direction of the frequency of the interfering signal.

For the above reasons, and when the fight frequency tolerance requirements are considered, AFC has not been considered to be a highly reliable or highly desirable method of operation of cellular telephones.

Therefore there is a need in the art for an improved method for determining the integrity of a received signal in a frequency tracking system.

There is also a need for a method for determining the integrity of a received signal at levels below which the RSSI does not operate accurately.

There is a further need for a method for determining the integrity of a received signal when there is the possibility of a strong interfering signal.

SUMMARY OF THE INVENTION

The present invention satisfies the above described needs by providing an improved system and method for determining the integrity of a received signal in a frequency tracking environment.

Briefly described, the present invention is directed to a method and system for determining the quality, or integrity, of a received signal in a frequency tracking environment so that a determination can be made whether Automatic Frequency Control can be utilized. Several consecutive measurements of the frequency of the limited IF output of a receiver are taken. These frequency measurements are used to calculate statistics on the frequency of the limited IF output. These statistics are then evaluated to determine if an adjustment in the receiver timebase/oscillator frequency is allowable. These statistics may include the mean, mean deviation, variance and standard deviation, among other statistics. The mean deviation of the measured frequency of the limited IF output signal increases as the received signal level decreases, that is, as the RSSI falls. Ultimately, as the received signal level decreases to zero, the mean deviation will be determined by the characteristics of the receiver itself, such as the IF bandwidth of the receiver.

Also, the average (mean) frequency of the limited IF output changes as the received signal level decreases. Ultimately, as the received signal level decreases to zero, the mean frequency will be determined by the characteristics of the receiver itself, such as the IF center frequency of the receiver. A weak signal deviation limit is used as the threshold for disabling AFC operation. If the mean deviation calculated is greater than the weak signal deviation limit, then the controller disables AFC operation. Therefore, the present invention allows the receiver to continue AFC operation until the signal level is so low that the frequency measurements will be erroneous and the AFC will be ineffective.

This also provides for disabling AFC operation in a changing signal environment such as fading. Fading is a condition in which the received signal strength is changing rapidly due to changing receiver location. For example, when a cellular telephone customer is using his cellular telephone in an automobile and is moving, fading, including multipath fading, and even a complete signal dropout, may occur. As above, if the mean deviation calculated is greater than the weak signal deviation limit, then the controller disables AFC operation.

The present invention tests certain statistics on the frequency measurements and the signal strength to determine if the signal should be used to set the frequency for AFC operation. These statistics may include, for example, the mean, the mean deviation, the variance, and the standard deviation. A strong signal deviation limit and a weak signal deviation limit are used to determine whether AFC operation should be disabled. If the calculated statistic is less than the strong signal deviation limit then AFC operation is enabled. If the calculated statistic is greater than the strong signal deviation limit and also greater than the weak signal deviation limit then the signal is too weak to be useful and so the AFC operation is disabled. This allows the receiver to possibly continue AFC operation until the signal level is so weak as to cause erroneous frequency measurements. If the calculated statistic is greater than the strong signal deviation limit but less than the weak signal deviation limit then the signal strength (the RSSI) is tested. In this case, if the signal strength is above a minimum value then AFC operation is disabled because, with that signal strength, the calculated statistic should have been less than the strong signal deviation limit. However, if the signal strength is below the minimum value then AFC operation is enabled because the calculated statistic is still within the acceptable deviation range because there is high confidence that a strong interfering source is not causing an inaccurate measurement.

More particularly described, the frequency of the received signal is measured several times and the standard deviation of the frequency is determined. If the received signal is strong, and there is no interfering signal, then the standard deviation will be less than a first value, referred to herein as the strong signal limit. Thus, AFC operation can be enabled. If the standard deviation is greater than the first value but still less than a second value, referred to herein as the weak signal limit, then the signal strength is tested. If the increased standard deviation is due to a weaker signal then the received signal strength will be less than a predetermined signal strength value. Thus, AFC operation can still be enabled. However, if the increased standard deviation is due to an interfering signal then the received signal strength will be greater than the predetermined value. Thus, the integrity of the received signal is poor and thus AFC operation will be disabled. If the standard deviation is greater than the second value then the integrity of the received signal is poor, indicating a weak, unusable signal. Thus, AFC operation will be disabled.

The present invention provides a method for determining whether the quality of a signal is acceptable. The method includes measuring the frequency of the signal N times, computing a statistic concerning the frequency of the signal, and if the statistic is less than a first predetermined value (the strong signal limit) then declaring the quality to be acceptable. Further, the method further includes determining whether the statistic is greater than a second predetermined value (the weak signal limit). If the statistic is greater than the weak signal limit then the received signal is deemed to be unacceptable. If the statistic for the signal is between the strong signal limit and the weak signal limit then the method further includes measuring the strength of the received signal. If the strength of the received signal is less than a predetermined signal strength value (the minimum RSSI value) then the received signal is deemed to be acceptable. However, if the signal strength is greater than the minimum RSSI value then there is probably an interfering signal, so the received signal is deemed to be unacceptable. The statistic used for the method may be, for example, the mean deviation, the standard deviation, or the variance of the measured frequency.

The present invention also provides a method for determining whether to enable automatic frequency control (AFC) operation based upon the quality of a signal. The method includes measuring the frequency of the signal N times, computing a statistic concerning the frequency of the signal, and if the statistic is less than a first predetermined value (the strong signal limit) then declaring the quality to be acceptable and enabling AFC operation. Further, the method further includes determining whether the statistic is greater than a second predetermined value (the weak signal limit). If the statistic is greater than the weak signal limit then the received signal is deemed to be unacceptable and AFC operation is disabled. If the statistic for the signal is between the strong signal limit and the weak signal limit then the method further includes measuring the strength of the received signal. If the strength of the received signal is less than a predetermined signal strength value (the minimum RSSI value) then the received signal is deemed to be acceptable and AFC operation is enabled. However, if the signal strength is greater than the minimum RSSI value then there is probably an interfering signal, so the received signal is deemed to be unacceptable and AFC operation is disabled. The statistic used for the method may be, for example, the mean deviation, the standard deviation, or the variance of the measured frequency.

The present invention further provides a receiver. The receiver includes a mixer for mixing a first signal, such as the received signal, and a second signal, such as an oscillator mixing frequency, to provide a third signal, such as an intermediate frequency (IF) signal. An oscillator provides the second signal. There is also a frequency control circuit, responsive to the IF signal, for controlling the frequency of the oscillator in an AFC operation. There is also a circuit for measuring the frequency of the third signal, and a controller. The controller includes means, such as a program, for determining a statistic on the frequency of the IF signal, and enabling the frequency control circuit, and thus AFC operation, if the statistic is less than a predetermined value, such as a strong signal limit. If the statistic is greater than the strong signal limit the controller determines whether the statistic is greater than a second predetermined value, the weak signal limit. If the statistic is greater than the weak signal limit then the controller disables the frequency control circuit, thereby disabling AFC operation. If the statistic is between the strong signal limit and the weak signal limit the controller measures the strength of the received signal and determines whether the strength is less than a predetermined signal strength value (the minimum RSSI value). If the received signal strength is less than the minimum RSSI value then the controller enables the frequency control circuit. However, if the received signal strength is greater than the minimum RSSI value then there is a strong likelihood that there is an interfering signal. Therefore, in this case controller disables the frequency control circuit. The controller has a program for determining the desired statistic, such as the mean deviation, the standard deviation, or the variance.

Thus, the present invention provides for evaluating the quality or integrity of the received signal so that a determination can be made whether to use the received signal as a frequency standard.

These and other features, advantages, and aspects of the present invention may be more clearly understood and appreciated from a review of the following detailed description of the disclosed embodiments and by reference to the appended drawings and claims.

DETAILED DESCRIPTION

Figure 1:
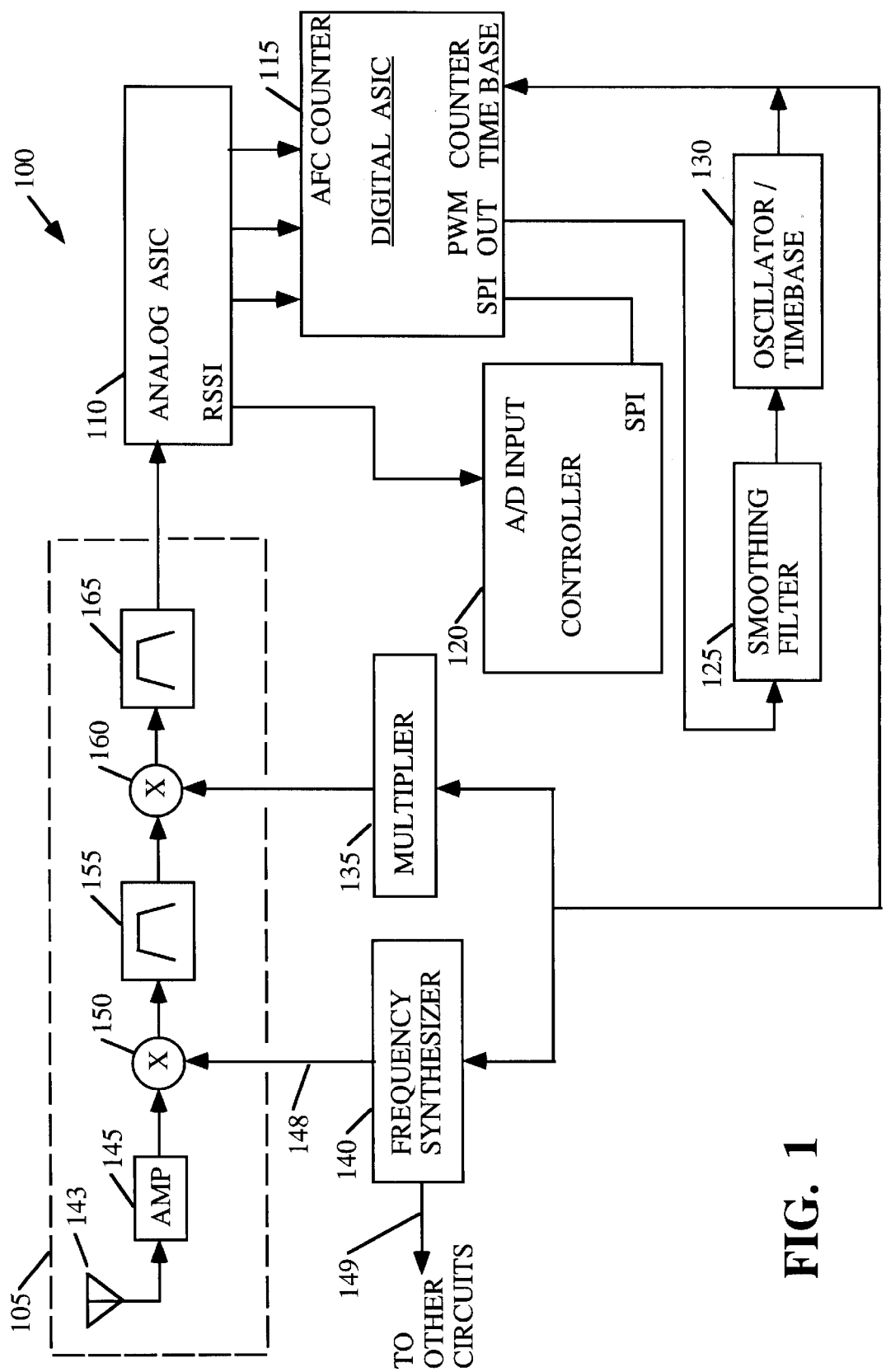
FIG. 1 is a block diagram of a system in accordance with the preferred embodiment of the present invention.

FIG. 1 is a block diagram of a system 100 in accordance with the preferred embodiment of the present invention. The apparatus includes a receiver 105, an analog Application Specific Integrated Circuit (ASIC) 110, a digital Application Specific Integrated Circuit 115, a controller 120, a smoothing filter 125, a timebase (oscillator) 130, a multiplier 135, and a frequency synthesizer 140. As further shown in FIG. 1, the receiver 105 includes an antenna 143, a low noise amplifier 145, a first mixer 150, a bandpass filter 155, and a second mixer 160. The system 100 is preferably included in a cellular telephone. However, the system 100 may be part of any device that requires a stable frequency reference and which can receive signals from another radio station that includes a frequency reference of the desired stability.

Receiver 105 is preferably a superheterodyne receiver. Superheterodyne receivers are well-known in the art. In general, a superheterodyne receiver converts an incoming modulated radio-frequency signal to a predetermined lower carrier frequency known as the intermediate frequency. This conversion is typically accomplished by using a local oscillator that is tuned with the input stage of the receiver so that the oscillator frequency always differs from the frequency of the desired incoming signal by the intermediate frequency. With a fixed intermediate frequency, an intermediate frequency amplifier can provide much of the amplification and selectivity required by the receiver. After amplification, the intermediate-frequency signal can be demodulated to obtain the desired output signal.

Still referring to FIG. 1, the operation of the invention in a cellular system will be described. A cellular signal, or received signal, is received by the antenna 143 and provided to a low noise amplifier 145 which is the input stage of receiver 105. The received signal is amplified by the amplifier 145 and sent to the first mixer 150. The first mixer 150 combines the amplified received signal with a first local oscillator signal on line 148 to produce a first intermediate frequency (IF) signal. The first IF signal is then passed through bandpass filter 155 to remove the undesired out-of-band frequencies.

The filtered first IF signal from the output of the filter 155 is then provided to a second mixer 160. The filtered first IF signal and the second local oscillator signal are combined by the second mixer 160 to obtain a second intermediate-frequency (IF) signal. In the preferred embodiment, the second IF signal should have a frequency of 450 kHz. The second IF signal is then passed through a second bandpass filter 165 to remove the undesired out-of-band frequencies.

The filtered second IF signal from the filter 165 is provided to the analog ASIC 110. As is known to those skilled in the art, an ASIC is a chip that has been built for a specific application so that many chips or functions can be combined into a single package to reduce the system board size and power consumption.

The analog ASIC 110 sends the detected Supervisory Audio Tone (SAT) and an amplitude-limited (square-wave) version of the second IF signal to the digital ASIC 115. The analog ASIC 110 measures the received signal strength and sends the RSSI information to the controller 120. The controller 120 uses the RSSI to determine whether the received signal power is strong enough to ensure that the signal to noise ratio is sufficient to provide accurate frequency tracking.

The digital ASIC 115 compares the frequency of the amplitudelimited second IF signal from the analog ASIC 110 with the frequency of the time base signal from the timebase 130 and provides this comparison via the Serial Port Interface (SPI) signal to the controller 120. Based on the SPI signal received from the digital ASIC 115 and the RSSI received from the analog ASIC 110, the controller 120 sends a digital pulse width modulation (PWM) signal to the digital ASIC 115. The digital ASIC then sends the PWM signal to the smoothing filter 125. The digital PWM signal could be sent directly from the controller 120 to the smoothing filter 125. However, the particular controller used by the inventors only had an eight-bit PWM output port and at least a ten-bit output was desired in order to achieve the desired tuning accuracy. Therefore, in the preferred embodiment, the digital ASIC 115 is designed to provide a ten-bit digital PWM output. The controller 120 sends the 10-bit digital PWM information to the digital ASIC 115 over the serial data (SPI) link, and the digital ASIC 115 converts the 10-bit serial data from the SPI link into a 10-bit parallel data signal for transmission to the smoothing filter 125.

The smoothing filter 125 accepts the digital 10-bit signal, converts it to an analog signal, and filters the analog signal to provide a filtered PWM signal to oscillator/timebase 130. The oscillator/timebase 130 is a voltage controlled crystal oscillator (VCXO) and provides an output time base signal whose frequency is dependent upon the output voltage from the smoothing filter 125. This time base signal may also be considered to be a reference oscillator signal. The reference oscillator signal is sent to the counter timebase input of the digital ASIC 115 and also to the multiplier 135 and the frequency synthesizer 140. The frequency of the reference oscillator signal is preferably multiplied by the multiplier 135. The multiplier factor of the multiplier 135 is determined by the output frequency of the oscillator/timebase 130 and the input frequency necessary for the second mixer 160 to provide the desired second IF output frequency. The output of the multiplier 135 is the second local oscillator signal that is sent to the second mixer 160.

The frequency synthesizer 140 preferably provides two output signals. A first output signal 148 is the first local oscillator signal that is sent to the first mixer 150. A second output signal 149 is provided to other circuitry needing a stable reference frequency. For example, the second output signal 149 may be provided to the transmitter circuitry in the cellular telephone.

Figure 2:
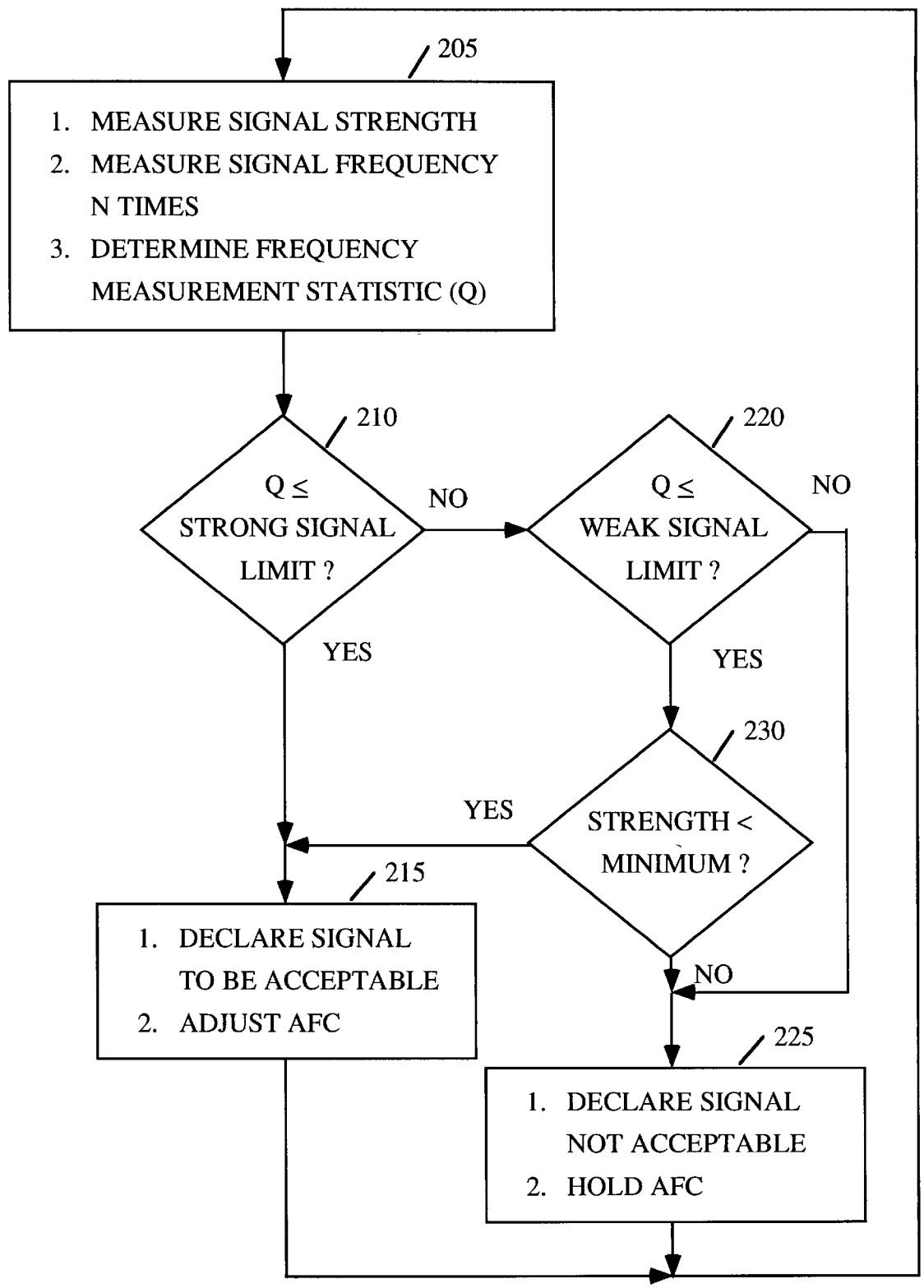
FIG. 2 is a flow chart of the method for determining the integrity of a received signal in accordance with the present invention.

FIG. 2 is a flow chart illustrating the method for determining the integrity of a received signal in accordance with the present invention.

Beginning at step 205, the signal strength of the received signal is measured. The frequency of the received signal is also measured N times at step 205, where N>0. A frequency measurement statistic, or statistical parameter, based on the measured frequencies, is also calculated at step 205. The frequency measurement statistic can be, but is not limited to, the mean deviation of the measured frequencies, the standard deviation of the measured frequencies, or the variance of the measured frequencies. It should be noted that more than one frequency measurement statistic can be calculated at step 205.

At decision 210, it is determined whether the frequency measurement statistic is less than or equal to a strong signal limit for the frequency measurement statistic. For example, if the frequency measurement statistic used is the mean deviation, then the strong signal limit is the largest mean deviation that a received signal can have if the received signal is to be considered a strong signal. If the frequency measurement statistic is less than or equal to the strong signal limit, then the method proceeds to step 215 and the received signal is declared to be a valid signal. Thus, AFC operation may be used and, if needed, the frequency of the oscillator/timebase 130 is adjusted accordingly based on the measured frequency of the received signal. After step 215, the method returns to step 205.

However, if at decision 210 it is determined that the frequency measurement statistic is greater than the strong signal limit, then the method proceeds to decision 220. A determination is then made at decision 220 whether the frequency measurement statistic is less than or equal to a weak signal limit. For example, if the frequency measurement statistic used is the mean deviation, then the weak signal limit is the largest mean deviation that a received signal can have if the received signal is to be usable for AFC operation.

If, at decision 220 it is determined that the frequency measurement statistic is greater than the weak signal limit then the received signal is declared to be an invalid signal and is not usable for AFC purposes. Thus, the AFC is held, i.e. not adjusted, at step 225. A return is then made to step 205.

However, if, at decision 220, it is determined that the frequency measurement statistic is less than or equal to the weak signal limit, that is, the frequency measurement statistic is between the strong signal limit and the weak signal limit, then further evaluation of the signal is required and so the method proceeds to decision 230. If the greater frequency error is due to a weaker signal then the RSSI level will be below some predetermined value, the minimum RSSI value. However, if the greater frequency error is due to an interfering signal then the RSSI level will be above that predetermined value. Thus, decision 230 tests whether the signal strength is less than a minimum dBm signal strength. If the signal strength is weak then there is no interfering signal so the method proceeds to step 215 where the received signal is declared to be a valid signal. Thus, AFC operation may be used and, if needed, the frequency of the oscillator/timebase 130 is adjusted accordingly based on the measured frequency of the received signal. After step 215, the method returns to step 205.

However, if, at decision 230, it is determined that the signal strength is greater than or equal to the minimum RSSI value then there must be an interfering signal. This arises because that level of RSSI value should indicate a signal which is strong enough to cause the deviation to be less than the strong signal limit. Therefore, the larger measured deviation must be due to a strong interfering signal. Thus, the received signal is declared to be an invalid signal and is not usable for AFC purposes so the AFC is held, i.e. not adjusted, at step 225. A return is then made to step 205.

Figure 3A:
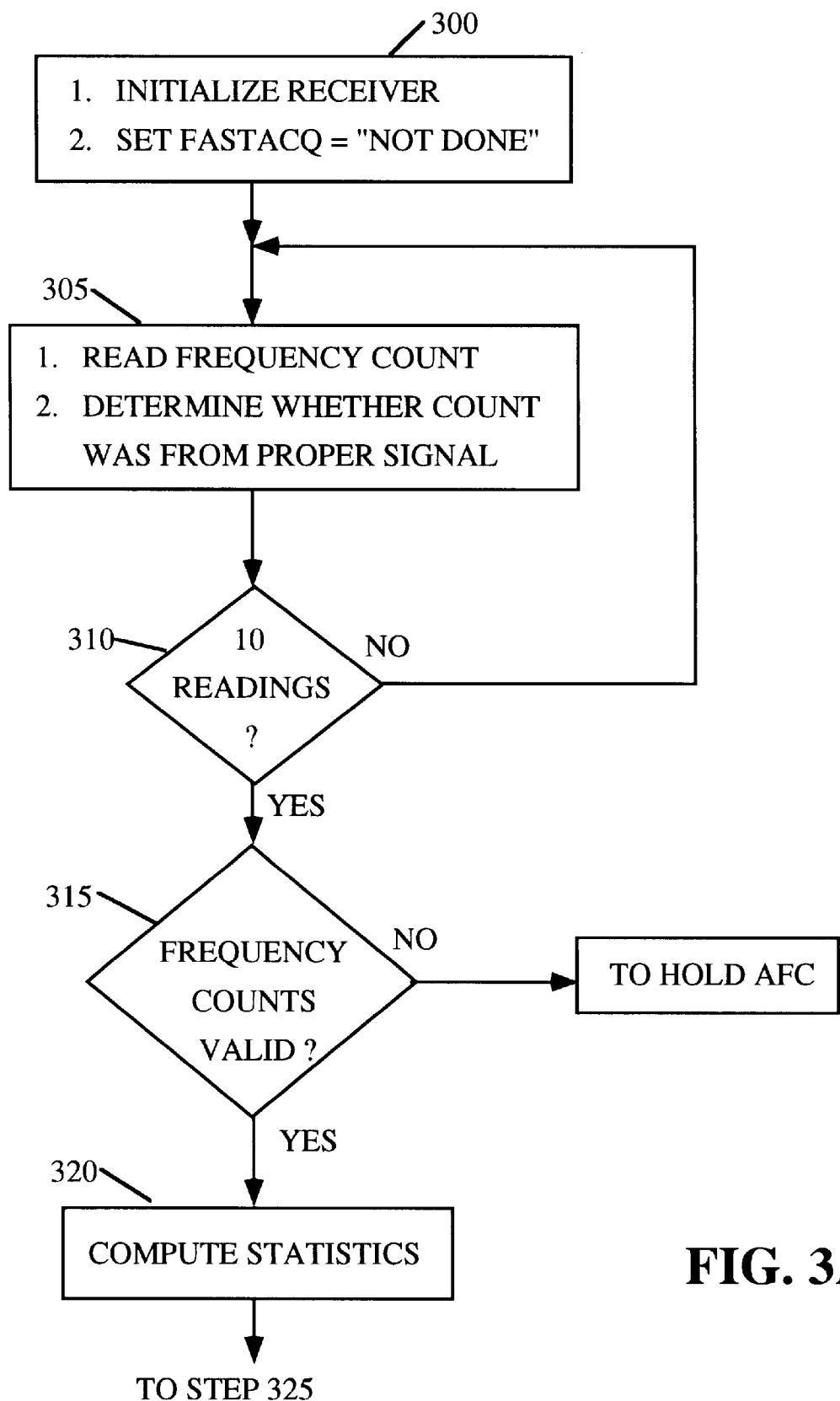
FIGS. 3A–3C are a flowchart of the details of the method for determining the integrity of a received signal in accordance with the preferred embodiment.
Figure 3B:
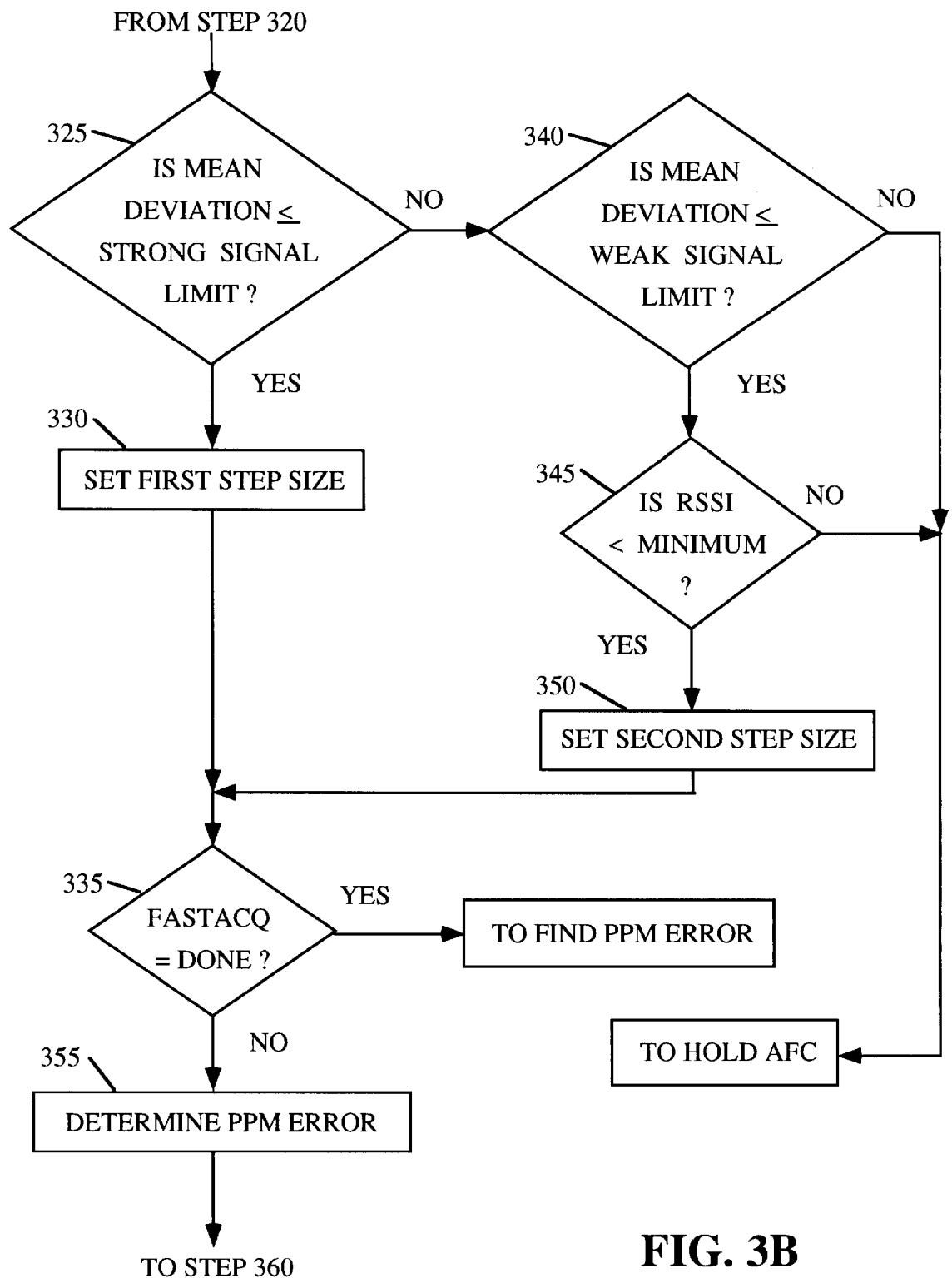
Figure 3C:
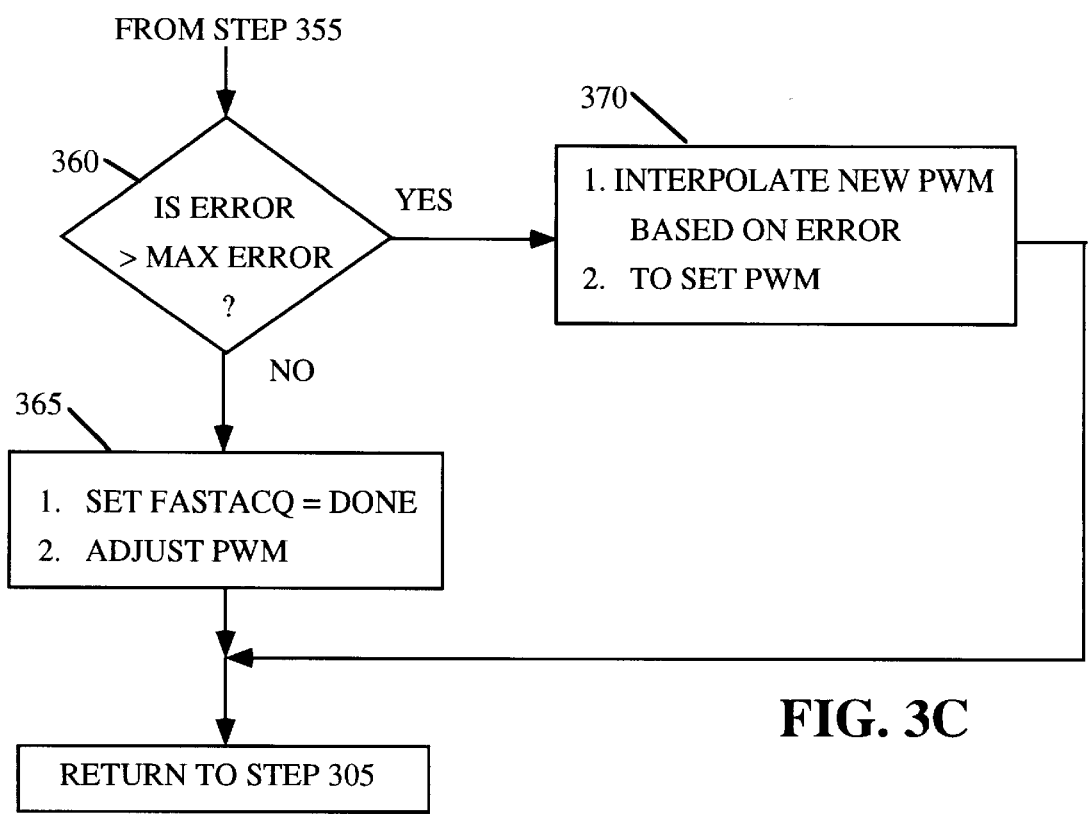

FIGS. 3A–3C are a flow chart illustrating the details of the method for determining the integrity of a received signal in accordance with the preferred embodiment. These steps are performed by the controller 120 (FIG. 1). The controller 120 has a memory, not shown, which contains a program. The program comprises a plurality of steps which function as means for performing the various operations described herein. The procedure starts at step 300 when the cellular telephone or other device comprising system 100 (FIG. 1), is turned on, or powered up. At step 300, the system is initialized. In this step the initial operating frequency of the oscillator/timebase 130 is determined by considering such factors as the ambient temperature and the aging factor for the crystal, and verification that the receiver is tuned to a valid forward control channel (FOCC). Examples of such procedures are shown in U.S. Pat. No. 4,922,212, PCT Publication Numbers WO 88/01810, WO 90/16113, and WO 96/24986, EPO Publication No. 0 483 090, and UK Patent Application Publication No. GB 2 205 460. Also, a variable "FastAcq" is set equal to "NOT DONE" because a Fast Acquire procedure has not been performed yet. A Fast Acquire procedure allows the receiver to make large adjustments in tuning so that the proper frequency may be obtained quickly. A Fast Acquire procedure may be necessary when a receiver is first attempting to lock to a received signal. However, after a lock is obtained, a Fast Acquire procedure should not be used because only small adjustments should be needed to track the frequency of the received signal and a large step may cause the receiver to break the lock with the received signal.

The procedure then moves to step 305 where a frequency count is read. The frequency count is a measure of the frequency of the second IF signal. In the preferred embodiment, the frequency count is the number of pulses of the reference oscillator signal which occur during a predetermined number, N, of pulses (N≧1) of the second IF signal. In an alternative embodiment, the reference oscillator signal may be divided down and the number of IF signal pulses counted. The frequency count is preferably read at the SPI output of digital ASIC 115 (FIG. 1). Also, it is determined whether the frequency count was a frequency count of a proper signal. For example, a frequency count taken may be a measurement of the frequency of an interfering signal, or noise. These frequency counts should not be considered in adjusting the AFC. Preferably, a determination is made as to whether the value of WordSync is equal to one for the received signal at the time each frequency count was made. If WordSync is equal to one, then the frequency count is considered valid and is marked as such. Otherwise, the frequency count is considered invalid and marked as such. The WordSync is a binary signal received from the cellular system that is used to verify that the receiver is receiving the proper signal. Preferably, the WordSync is equal to a binary one to indicate that the receiver is receiving a proper signal.

Decision 310 then determines whether a predetermined number of frequency counts have been read at step 305. In the preferred embodiment, ten readings are taken. Based on performance testing, it is also preferable to use a sample period of 68 milliseconds to count the number of pulses for the frequency count reading. If ten readings have not been taken then the method returns to step 305 to read another frequency count. If ten frequency counts have been taken then the method proceeds to decision 315.

Decision 315 determines whether the frequency counts that were taken at step 305 were valid frequency counts by determining whether at least one-half of the frequency counts taken at step 305 are valid, or in other words, had WordSync values equal to one. If a determination is made that less than half of the frequency counts are valid then the method proceeds to the "Hold AFC" routine described in FIG. 4. However, if it is determined that at least half of the frequency counts are valid, then the method proceeds to step 320.

At step 320 statistics for the frequency counts are computed. These statistics are used to determine whether the received signal may be used to perform an adjustment to the oscillating frequency. Preferably, these statistics include the mean deviation and mean frequency for the frequency counts. The particular controller used by the inventors did not have a floating point processor. Therefore, the mean deviation was used. However, if a controller is used which has a floating point processor, then the standard deviation or the variance would be used. However, other statistics could be calculated for the counts, including, but not limited to, standard deviation and variance. For example, the equations for mean deviation, standard deviation, variance and mean are listed below.

$$\text{mean deviation} \quad x_{mean\,dev} = \frac{1}{n}\sum_{i=1}^{n} |x_i - x_{mean}|$$

$$\text{standard deviation} \quad \sigma = \sqrt{\left(\sum (x - x_{mean})^2 / n\right)}$$

$$\text{variance} \quad \sigma^2 = \left(\sum (x - x_{mean})^2 / n\right)$$

$$\text{mean frequency} \quad x_{mean} = \frac{1}{n}\sum_{i=1}^{n} x_i$$

Decision 325 determines whether the mean deviation is less than or equal to the strong signal limit. The strong signal limit is preferably the largest mean deviation that is acceptable for a signal to be considered a strong signal. If the mean deviation is less than or equal to the strong signal limit then the frequency counts are sufficiently close enough to each other that the received signals can be considered to be strong signals rather than noise so step 330 is executed next. At step 330, the step size is set to a first value. Preferably, the first value for the step size is selected so as to allow the oscillator to approach the desired frequency in a single step. The process then proceeds to decision 335.

If, at decision 325, it is determined that the mean deviation is greater than the strong signal limit then decision 340 tests whether the mean deviation is less than or equal to a weak signal limit. The weak signal limit is the largest mean deviation that is acceptable for a weak signal. If a received signal has a larger mean deviation than the weak signal limit it is considered to be a poor quality signal and so AFC operation is not used. That is, no adjustments are made to the oscillator frequency based on the received signal. If the mean deviation is greater than the weak signal limit, then the method proceeds to the "Hold AFC" routine described in FIG. 4.

If at decision 340 it is determined that the mean deviation is less than or equal to the weak signal limit then the method proceeds to decision 345. At this point it has been determined that the mean deviation is between the strong signal limit and the weak signal limit, so the mean deviation is still within acceptable limits. However, before using these signal for AFC operation, it must be determined whether the greater mean deviation is due to a weak signal or an interfering signal. If the greater mean deviation is due to a weak signal then the received signal may be used for AFC operations. However, if the greater mean deviation is due to an interfering signal then the received signal should not be used for AFC operation. Therefore, an additional test is made. Decision 345 tests whether the received signal strength (RSSI) less than a minimum RSSI value. Preferably, the minimum RSSI value is set at −110 dBm. If the RSSI is less than the minimum RSSI value then the received signal is weak but is strong enough to be used for AFC operation. However, if the RSSI is greater than the minimum RSSI value then the received signal is strong, and so the mean deviation should be less than the strong signal limit. This may occur when there is a strong interfering signal. If the RSSI is greater than or equal to −110 dBm then the received signal should be sufficiently strong to cause the mean deviation to be small, that is, less than or equal to the strong signal limit. However, if the RSSI is greater than or equal to −110 dBm and the mean deviation is greater than the strong signal limit then there must be an interfering signal which is strong enough to affect the frequency count. In this case it is not possible to tell whether the mean frequency is due to the desired signal or due to the interfering signal. Therefore, a greater mean deviation coupled with a strong RSSI mean that there is an interfering signal. Therefore, the received signal is not used for AFC operation.

If the RSSI is less than the minimum dBm value, then the method proceeds to step 350. At step 350, the step size is to a second value. The second value for the step size is selected to be a small value so that any changes in the oscillator frequency will be small. The process then proceeds to decision 335. However, if at decision 345 the RSSI is not less than the minimum dBm value then the method proceeds to the "Hold AFC" routine described in FIG. 4.

A small step size is used at this point because lock has already been achieved and a large step size may cause the receiver to lose lock with the received signal. Also, when the signal is weak, the measured deviation will be due to both the actual frequency difference (between the oscillator frequency and the received signal frequency), and to noise. The mean deviation measurements due to noise will tend to average to zero over a period of time. Therefore, if a larger step size is used, noise will cause the oscillator frequency, and therefore the transmitted frequency, to jump around randomly. A smaller step size therefore improves frequency stability. Also, the smaller step size will allow the oscillator to steadily and smoothly approach the desired frequency.

After the step size is set at either step 330 or step 350, then the method proceeds to decision 335. A determination is made whether FastAcq is equal to "DONE" at decision 335. This is to determine whether a Fast Acquire procedure has or has not been performed yet. If it is determined that FastAcq is equal to "DONE", then the method proceeds to the "Find PPM Error" routine described in FIG. 5. However, if, at decision 335, it is determined that FastAcq is not equal to "DONE", then the method proceeds to step 355 where a parts per million (ppm) error is determined. The ppm error is equal to the absolute value of the difference between the mean of the frequency counts and a reference mean. The reference mean is equal to the standard frequency value of the second intermediate frequency signal. For example, the reference mean is preferably equal to 450 kHz which is the preferred frequency of the second intermediate frequency signal.

After the error is determined at step 355 decision 360 tests whether the error is greater than a maximum error. Preferably, the maximum error is set at 2 parts per million. If at decision 360 the error is greater than the maximum error then the method proceeds to step 370. In step 370 a new PWM value is determined. The PWM value may be determined from reference to a table, by interpolating between two values for a predetermined range of the error, or by an equation. The PWM is then set in the "Set PWM" routine described in FIG. 6. The method then returns to step 305.

If, at decision 360, the error is less than or equal to the maximum error then the method proceeds to step 365 where the FastAcq variable is set to "DONE" and the step size is used to adjust the PWM value. The method then returns to step 305.

Figure 4:
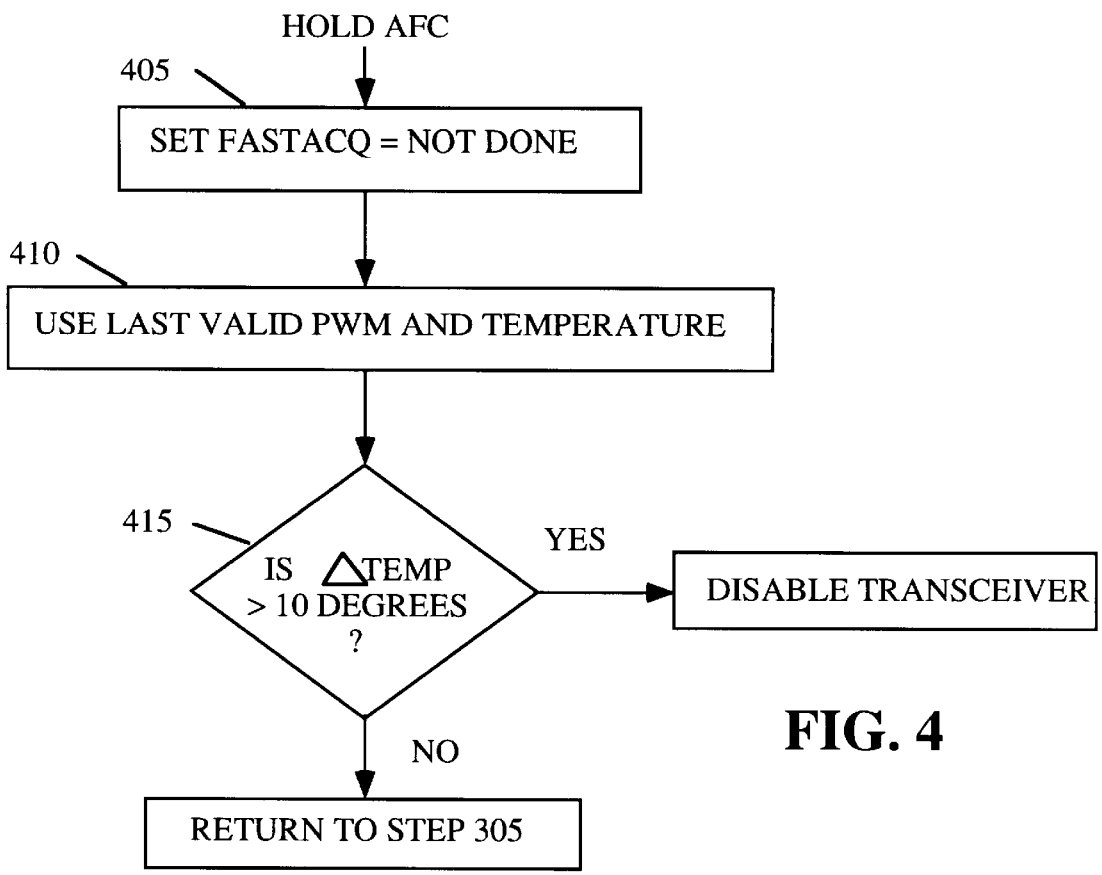
FIG. 4 is a flowchart of the "Hold AFC" routine.

FIG. 4 is a flowchart of the "Hold AFC" routine. The FastAcq variable is set to "NOT DONE" at step 405. At step 410, the last valid temperature and last valid PWM value are read. At decision 415, a determination is made whether there has been a change in temperature of greater than ten degrees Celsius since the last valid temperature. Preferably, this determination is made by comparing the last valid temperature with the present temperature.

If it is determined that there has not been a change in temperature of greater than ten degrees then a return is made to step 305. If it is determined that there has been a change in temperature of greater than ten degrees then the cellular telephone is disabled.

Figure 5:
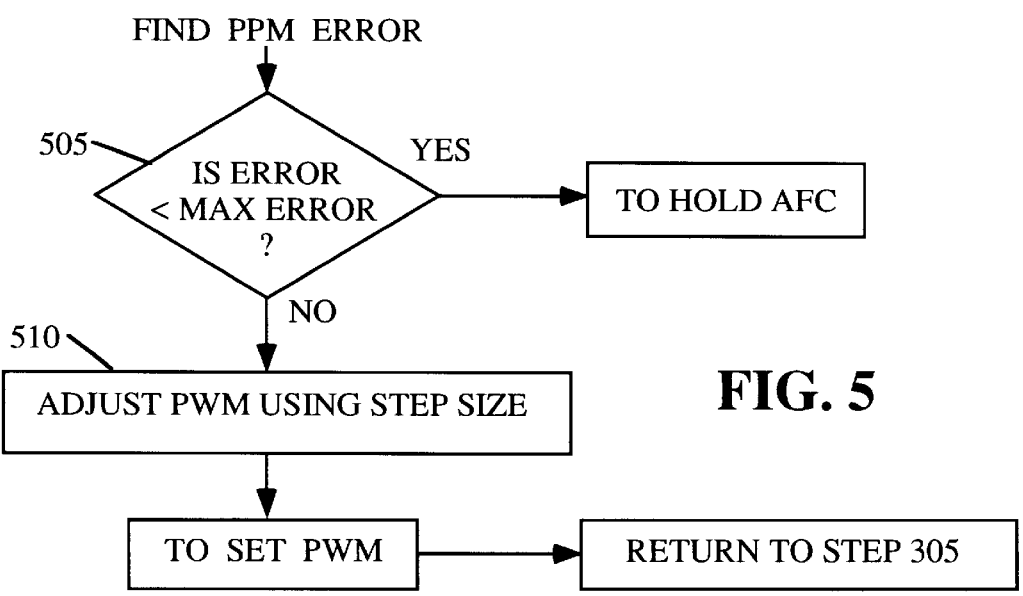
FIG. 5 is a flowchart of the "Find PPM Error" routine.

FIG. 5 is a flowchart of the "Find PPM Error" routine. As mentioned above, the ppm error is equal to the absolute value of the difference between the mean of the frequency counts and a reference mean. Decision 505 tests whether the ppm error is less than the maximum parts per million error. If the ppm error is less than the maximum error then the method proceeds to the "Hold AFC" routine of FIG. 4.

Figure 6:
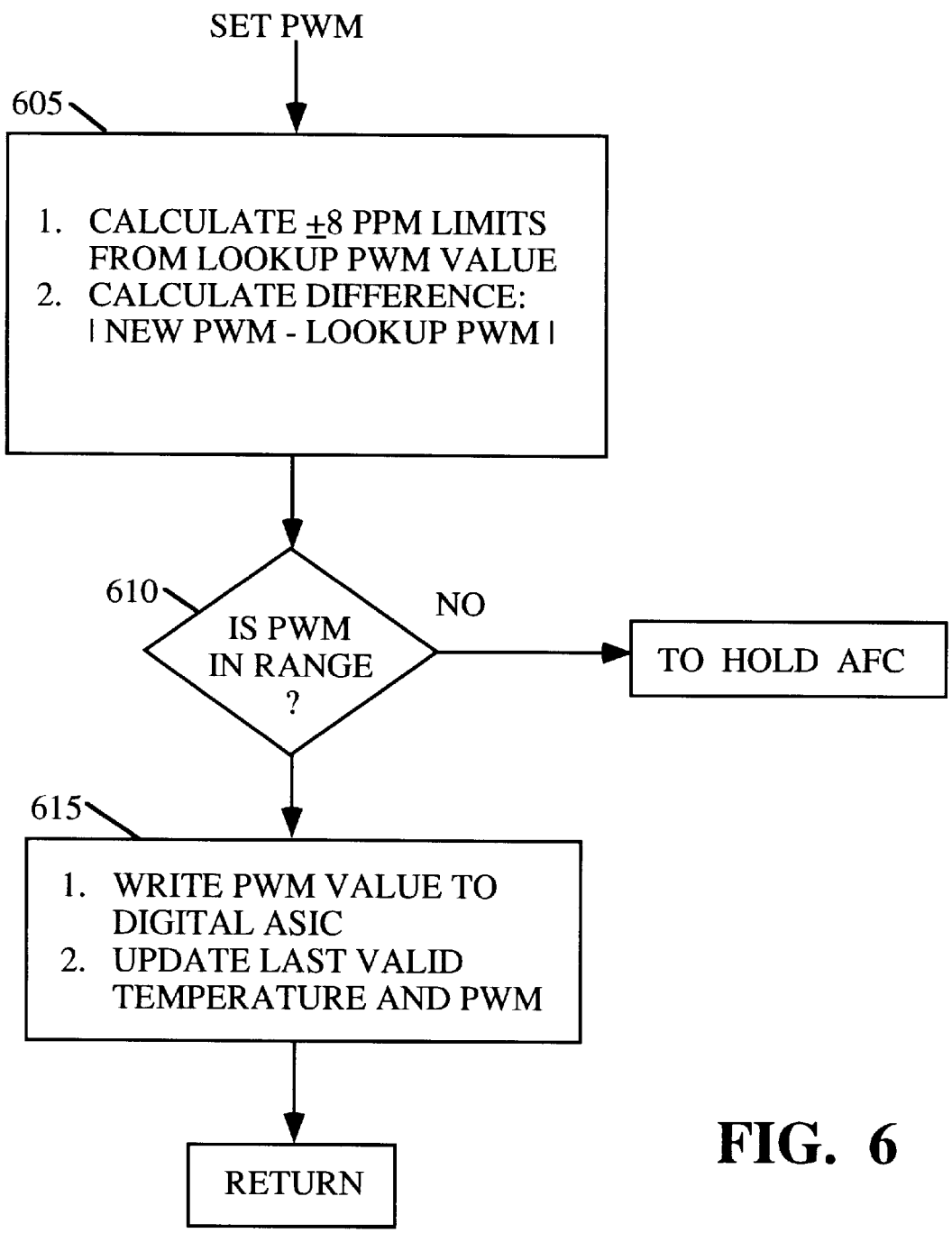
FIG. 6 is a flowchart of the "Set PWM" routine.

However, if it is determined that the ppm error is not less than two parts per million, then the method proceeds to step 510. The step size that was set at either step 330 or 350 is used to adjust the PWM value. The adjustment is made either up or down in the direction required to reduce the error. The "Set PWM" routine of FIG. 6 is then executed. A return is then made to step 305.

FIG. 6 is a flowchart of the "Set PWM" routine. At step 605 an upper limit and a lower limit are calculated at plus and minus, respectively, eight parts per million from the PWM table value. Then the magnitude of the difference between the calculated PWM and the PWM table value is determined. Decision 610 tests whether the calculated PWM is permissible. A calculated change in the PWM that is too large may cause the receiver to break lock, or may be due to a strong interfering signal. Preferably, this is accomplished by determining whether the magnitude of the difference calculated is within the limits calculated above.

If the calculated PWM is not permissible, then the method proceeds to the "Hold AFC" routine of FIG. 4. If the calculated PWM is permissible then the method proceeds to step 615 where the calculated PWM value is written to the digital ASIC 115, where it is then sent to the smoothing filter 125. If the calculated PWM value is valid then the last valid temperature and the last valid PWM is updated. A return is then made to the step which called the Set PWM routine.

From the foregoing description, it will be apparent to those skilled in the art that the present invention provides a method and system for determining the integrity of a received signal in a frequency tracking environment so that a determination can be made whether Automatic Frequency Control can be utilized. Several frequency samples of the output of a receiver are taken, preferably consecutively. Statistics of these frequency samples are calculated to determine if an adjustment is needed in the frequency of a reference oscillator signal. These statistics may include, for example, the mean, the mean deviation, the variance and the standard deviation. A weak signal limit is used as the threshold for disabling AFC operation. If the mean deviation is greater than the weak signal limit then the controller disables AFC operation. However, if the standard deviation is less than the weak signal limit but the signal strength is above a specified minimum level, then the controller still disables the AFC operation if the standard deviation is greater than the strong signal limit. This reduces the likelihood that the oscillator will be pulled to an improper frequency by a strong interfering signal. Therefore, the present invention allows the receiver to continue AFC operation even with a very weak signal, but disables AFC operation in the event that a strong interfering signal is present.

From the foregoing description, it will also be apparent to those skilled in the art that the present invention provides a method for disabling AFC operation when the signal is too weak or there is an interfering signal.

Alternative embodiments will become apparent to those skilled in the art to which the present invention pertains without departing from its spirit and scope. Accordingly, the scope of the present invention is defined by the appended claims.

We claim:

1. A method for determining whether the quality of a signal is acceptable, comprising the steps of:

measuring the frequency of said signal N times;

computing a statistic concerning said frequency of said signal;

if said statistic is less than a first predetermined value then declaring said quality to be acceptable;

if said statistic is greater than said first predetermined value then determining whether said statistic is greater than a second predetermined value;

if said statistic is greater than said second predetermined value then declaring said signal to be unacceptable;

if said statistic is less than said second predetermined value then measuring the strength of said signal; and if said signal strength is less than a predetermined signal strength value then declaring said received signal to be acceptable whereby quality use of the signal is maximized by accepting signals of relatively low signal strength having little interference and rejecting signals of high signal strength having interference.

2. The method of claim 1 and further comprising the step of declaring said signal to be unacceptable if said signal strength is greater than said predetermined signal strength value.

3. The method of claim 1 wherein said step of computing a statistic comprises determining a mean deviation for said signal.

4. The method of claim 1 wherein said step of computing a statistic comprises determining a standard deviation for said signal.

5. The method of claim 1 wherein said step of computing a statistic comprises determining a variance for said signal.

6. A method for determing whether to enable automatic frequency control (AFC) operation based upon the quality of a signal, comprising the steps of:

measuring the frequency of said signal N times;

computing a statistic concerning said frequency of said signal;

if said statistic is less than a first predetermined value then enabling said AFC operation;

if said statistic is greater than said first predetermined value then determining whether said statistic is greater than a second predetermined value;

if said statistic is greater than said second predetermined value then disabling said AFC operation;

if said statistic is less than said second predetermined value then measuring the strength of said signal and determining whether said strength is less than a predetermined signal strength value; and if said strength is less than said predetermined signal value then enabling said AFC operation, whereby AFC use of the signal is maximized by accepting signals of relatively low signal strength having little interference and rejecting signals of high signal strength having interference.

7. The method of claim 6 and further comprising the step of disabling said AFC operation if said signal strength is greater than said predetermined signal strength value.

8. The method of claim 6 wherein said step of computing a statistic comprises determining a mean deviation for said signal.

9. The method of claim 6 wherein said step of computing a statistic comprises determining a standard deviation for said signal.

10. The method of claim 6 wherein said step of computing a statistic comprises determining a variance for said signal.

11. A receiver, comprising:

a mixer for mixing a first signal and a second signal to provide a third signal;

an oscillator for providing said second signal;

a frequency control circuit responsive to said third signal for controlling the frequency of said oscillator;

a circuit for measuring the frequency of said third signal; and a controller comprising means for determining a statistic on said frequency of said third signal and enabling said frequency control circuit if said statistic is less than a first predetermined value, means for determining whether said statistic is greater than a second predetermined value if said statistic is greater than said first predetermined value, and means for disabling said frequency control circuit if said statistic is greater than said second predetermined value.

12. The receiver of claim 11 wherein said controller further comprises:

means for measuring the strength of said signal and determining whether said strength is less than a predetermined signal strength value if said statistic is less than said second predetermined value; and means for enabling said frequency control circuit if said strength is less than said predetermined signal strength value.

13. The receiver of claim 12 wherein said controller further comprises means for disabling said frequency control circuit if said signal strength is greater than said predetermined signal strength value.

14. The receiver of claim 11 wherein said controller further comprises means for computing a mean deviation for said signal.

15. The receiver of claim 11 wherein said controller further comprises means for computing a standard deviation for said signal.

16. The receiver of claim 11 wherein said controller further comprises means for computing a variance for said signal.

* * * * *